United States Patent [19]
Tomimatu

[11] Patent Number: 5,773,180
[45] Date of Patent: Jun. 30, 1998

[54] MEASURING METHOD OF A RELATIVE POSITIONAL DEVIATION OF RETICLE PATTERN

[75] Inventor: Yoshikatu Tomimatu, Tokyo, Japan

[73] Assignee: Mitsubishi Denki Kabushiki Kaisha, Tokyo, Japan

[21] Appl. No.: 663,812

[22] Filed: Jun. 14, 1996

[30] Foreign Application Priority Data

Dec. 13, 1995 [JP] Japan ................................ 7-324433

[51] Int. Cl.⁶ .......................... G03F 9/00; G06K 9/00
[52] U.S. Cl. ........................ 430/22; 356/399; 382/144
[58] Field of Search ....................... 430/22; 356/399; 382/144

[56] References Cited

U.S. PATENT DOCUMENTS

| | | | |
|---|---|---|---|
| 4,835,078 | 5/1989 | Harvey et al. ........................ | 430/22 |
| 5,498,500 | 3/1996 | Bae ...................................... | 430/22 |
| 5,543,256 | 8/1996 | Shinoda et al. ..................... | 430/22 |
| 5,578,401 | 11/1996 | Hwang ............................... | 430/22 |
| 5,616,438 | 4/1997 | Hwang ............................... | 430/22 |

*Primary Examiner*—Christopher G. Young
*Attorney, Agent, or Firm*—Oblon, Spivak, McClelland, Maier & Neustadt, P.C.

[57] ABSTRACT

In a projection exposure apparatus which exposes a semiconductor wafer, a reticle is set on a reticle stage, a wafer is set on a wafer stage, and a reticle pattern is projected and exposed on a wafer. In the pattern formed on the wafer, a positional deviation of the pattern is measured with reference a reticle alignment mark. With regard to a plurality of wafers, a difference between positional deviations of the projected patterns at the same coordinate position is obtained, and a relative positional deviation of the reticle patterns is determined.

6 Claims, 6 Drawing Sheets

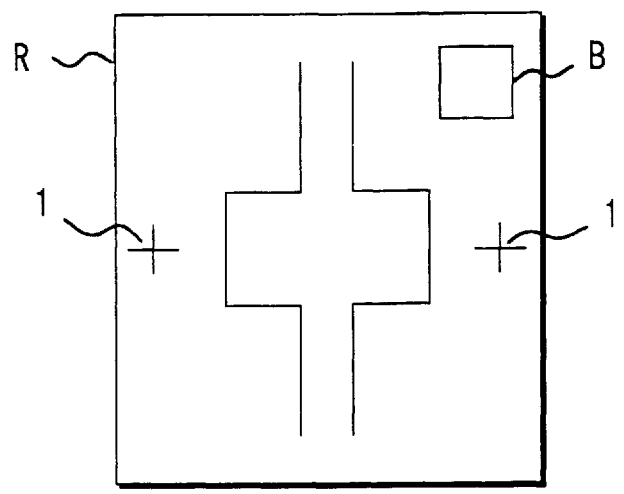
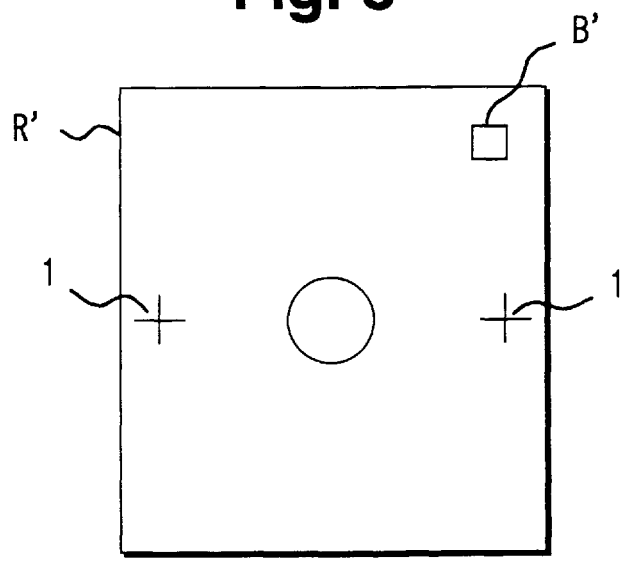

MEASURING METHOD OF A RELATIVE POSITIONAL DEVIATION OF RETICLE PATTERN

BACKGROUND OF THE INVENTION

1. Field of the Invention

The present invention relates to a reticle used in a manufacturing process of a semiconductor apparatus and, more particularly, to an apparatus and a method for measuring a relative difference in deviation of a position of each pattern drawn on a plurality of reticles used in a manufacturing process.

2. Description of the Background Art

In semiconductor wafer processing, a requirement of precision projection exposure technique has been increasingly severe under the background of advancement in micronization technology. Hence it is an essential requirement to improve both a manufacturing precision of reticles used in exposure and a projection precision in a projection exposure system. For that purpose, it is required to measure separately a manufacturing error of a pattern made in reticle manufacturing, and a projection error of the pattern in a projection exposure system, and to minimize both errors.

In a conventional measuring method, the following attempt has been carried out for this purpose. FIG. 7 is a schematic diagram of a pattern of a reticle R which includes a reticle alignment mark 1, and a target box B as a part of the pattern. FIG. 8 is a schematic diagram of a pattern of another reticle R' which similarly includes a reticle alignment mark 1 and a target box B'.

A manufacturing error of patterns on the two reticles R, R', that is a deviation in a pattern position, is measured in the following manner. With regard to the two reticles R, R', a reticle center positions is determined by each reticle alignment mark 1, and the center positions and the reticle alignment marks 1 are established as reference positions. Then with regard to both reticles R, R', target boxes B, B' located at a same specific position are targets to be measured. The boxes B, B' are in a relation of a box in a box. The positions of the target boxes B, B', are measured on the basis of design coordinate values, and a positional deviation amount b on the reticle R is obtained. In the same manner, a positional deviation amount b' of the target box B' on the reticle R' is obtained. A relative pattern deviation of two reticles R, R' is obtained as b–b'.

This measurement is performed as follows. First, a reticle pattern is moved to beneath an objective lens by using an XY stage, and light from a mercury lamp is emitted to the reticle pattern through a window on a slit. By repeating scanning in the X-Y direction, the reticle pattern is projected on a wafer, and a positional deviation of the pattern on the wafer is measured. That is, a measurement of length or position is performed using a conventional measuring instrument, for example, measuring instruments such as model 3I and 5I made by Nikon or model LMS2020 made by Leica. Supposing a magnification of the projection exposure system is five times, the deviation on the reticle corresponds to a deviation amount of (b–b')/5 on the wafer.

Then, a projection error of the projection exposure system is measured. First, on the wafer, the target boxes B, B' of both reticles are overlaid and exposed. FIG. 9 is a schematic diagram of a pattern of a wafer projected and exposed by overlaying the two reticles R, R' on a same wafer. FIG. 10 is an enlarged view of parts of the target boxes B, B' shown in FIG. 9. As shown in FIG. 10, box B' is not exactly centered within box B, and gaps d1 and d2 are measured by a measuring instrument, for example, a measuring instrument such as a model KLA5100 of Tokyo Electron or the like. Positional deviation of both boxes is obtained as (d1–d2)/2.

This deviation is a sum of the deviation due to the relative deviation of the reticle patterns on the two reticles R, R' and the deviation due to the projection exposure system. Accordingly, the deviation caused by the projection exposure system is obtained as (d1–d2)/2–(b–b')/5, by subtracting the amount of the positional deviation caused by the target box deviation on the reticles.

There is, however, a disadvantage in such a conventional measuring method. More specifically, for measuring a deviation of the pattern, there are several factors to be corrected such as drift for a long time measurement and fluctuation of reticle flatness.

It is, however, difficult to perfectly correct these errors. Moreover, the reticle state at the time of a deviation measurement is not the same as the reticle state at the time of setting in a projection exposure device such as a stepper. That is, when the reticle is set in a projection exposure apparatus, the state is upside down as compared with the state of measuring. Furthermore, the reticle is supported by three points at the time of measuring, while four points are supported in a vacuum at the time of setting in the projection exposure apparatus, and therefore the flatness varies due to its own weight. This variation in the measuring states is not corrected accurately.

Recently, finer processing techniques have made great advances and a precision of several nanometers or less is now required for measuring the relative deviation of patterns exposed on a wafer. It applies also to the deviation measurement due to a shift of the reticle pattern or due to the projection exposure system. Any causes of a relative deviation of exposed patterns on a wafer cannot be fully investigated on the basis of the deviation measurement of reticle patterns which is not set in a projection exposure system. Thus, the conventional measuring method of a deviation in a reticle is not sufficient.

SUMMARY OF THE INVENTION

The present invention was made to solve the above-discussed problems and has an object of providing a method and an apparatus for measuring precisely a positional deviation of patterns drawn on a reticle. More specifically, an object of the invention is to provide an improved method and apparatus in which patterns of a plurality of reticles mounted on a reticle stage are projected on a wafer mounted on a wafer stage in a projection exposure apparatus, and a relative positional deviation of patterns of a plurality of reticles is measured precisely on the basis of the relative pattern deviation on the wafer.

It is to be noted that a positional deviation of patterns drawn on reticles used in a manufacturing process of a semiconductor wafer involves a deviation of patterns from a reference position in one reticle, i.e., an absolute error, and a difference in the amount of positional deviations of patterns drawn on a plurality of reticles used in one manufacturing process, i.e., a relative error. The present invention is directed to the latter, i.e., the relative error of positional deviation of patterns between a plurality of reticles where the respective patterns at least contain a common feature.

An aspect of the present invention is a method for measuring a relative positional deviation of reticle patterns in which each reticle pattern on an individual wafer is projected and formed by a projection exposure means. A positional deviation of each projected pattern on the individual wafer is measured from a reference point of each pattern. A difference in positional deviation of each pattern of the individual reticle is then determined from a difference in positional deviation of each projected pattern at the same coordinate position on the individual wafer.

Another aspect of the present invention is a method for measuring a relative positional deviation of a pair of reticle patterns in which a pattern of a first reticle mounted on a reticle stage is projected onto a wafer position on a wafer stage by a projection exposure means. A pattern of a second reticle mounted on the reticle stage is projected onto the wafer position on the wafer stage by the projection exposure means. A positional deviation of each projected pattern is then measured from a reference point of each pattern formed on the wafer position. A relative positional deviation of the patterns of the first and second reticles mounted on the reticle stage is obtained from a difference in the positional deviation of each projected pattern on the wafer position.

Another aspect of the present invention is a method for measuring a relative positional deviation of a pair of reticle patterns in which a pattern of a first reticle mounted on a reticle stage is projected onto a first wafer mounted on a wafer stage by a projection exposure means. A pattern of a second reticle mounted on the reticle stage is also projected onto a second wafer mounted on the wafer stage by the projection exposure means. A positional deviation of each pattern formed on the first and second wafers is then measured from each reference point. A relative positional deviation of the patterns of the first and second reticles mounted on the reticle stage is obtained from a difference in positional deviation at the same coordinate position of the respective patterns formed on the first and second wafers.

Another aspect of the present invention is a method for measuring a relative positional deviation of the reticle patterns as stated above respectively, in which the positional deviation of a projected pattern is measured by using an alignment mark as a reference point.

Still another aspect of the present invention is an apparatus for measuring a relative positional deviation of reticle patterns which includes a projection exposure means for projecting patterns of a set of reticles at a wafer position. The apparatus further includes a positional deviation measuring means which measures a positional deviation of each projected pattern from each pattern reference point on the wafer position, and obtains a difference in positional deviation of the patterns on the reticles.

A further aspect of the present invention is an apparatus for measuring a relative positional deviation of reticle patterns which includes a projection exposure means for projecting a pattern of a reticle mounted on a reticle stage onto a wafer mounted on a wafer stage by a photo-transfer technique. The apparatus further includes a positional deviation measuring means which measures a positional deviation of each projected pattern from each reference point formed on each wafer, and obtains a difference in a positional deviation of the patterns of the reticles mounted on the reticle stage.

Other features and advantages of the invention will be apparent from the following description taken in connection with the accompanying drawings.

BRIEF DESCRIPTION OF THE DRAWINGS

FIG. 7 is a schematic diagram of a reticle pattern.

FIG. 8 is a schematic diagram of another reticle pattern.

DETAILED DESCRIPTION OF THE PREFERRED EMBODIMENTS

This invention will be described in further detail by way of example with reference to the accompanying drawings.

First, an outline of a preferred embodiment of the present invention is described. To begin with, for a process of a measuring method, each of the patterns of two reticles are formed on wafers by photo-transfer technique using a projection exposure apparatus such as a stepper. As a result, two wafers are formed. Then, as to the pattern on each wafer, its positional deviation is measured with reference to an alignment mark by using a wafer position deviation measuring apparatus. The difference of wafer pattern deviation obtained by each measurement on the same coordinate position shows an amount of relative positional deviation of the wafer patterns caused by positional deviation of the reticle patterns. When returning the positional deviation (amount) of the patterns on the wafer by a reduction scale factor of the projection exposure apparatus, for instance by magnifying 5 times in case of reduction of ⅕, a relative deviation amount of drawing positions of the two reticles is obtained.

Figure 1:
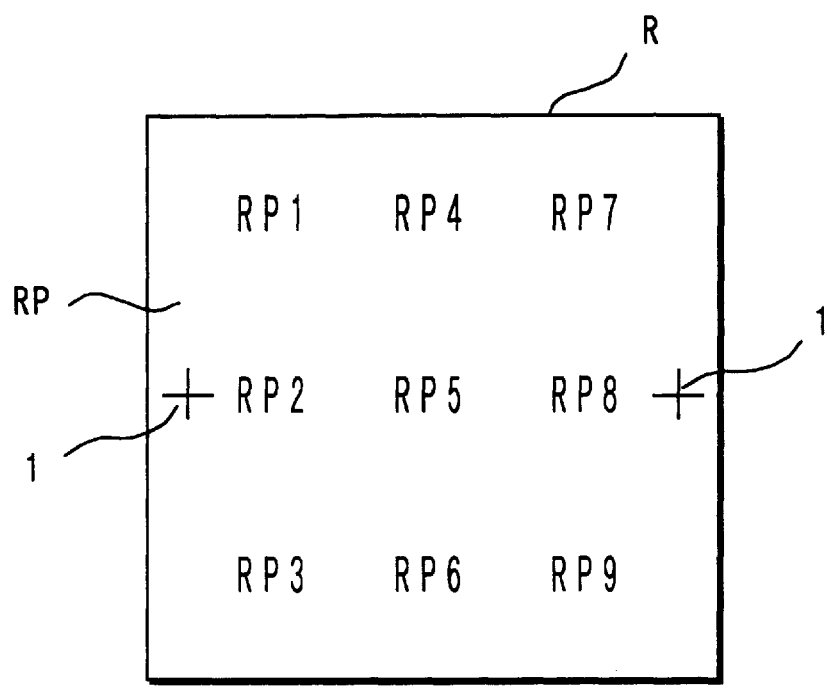
FIG. 1 is a schematic diagram of a reticle pattern to be processed in the present invention.

An embodiment of the present invention is described hereinbelow. FIG. 1 shows an example of a set of patterns drawn on a reticle R. In the drawing, the reticle R includes reticle alignment marks 1 and a set of patterns RP which is comprised of individual patterns RP1 to RP9. In this reticle R, the center point of the two reticle alignment marks 1 is considered the central point, and the central point and the reticle alignment marks 1 become the position references. For each pattern RP1 to RP9 on the reticle R, the positional deviation from the designed reference position is supposed to be RE1 to RE9.

Figure 2:
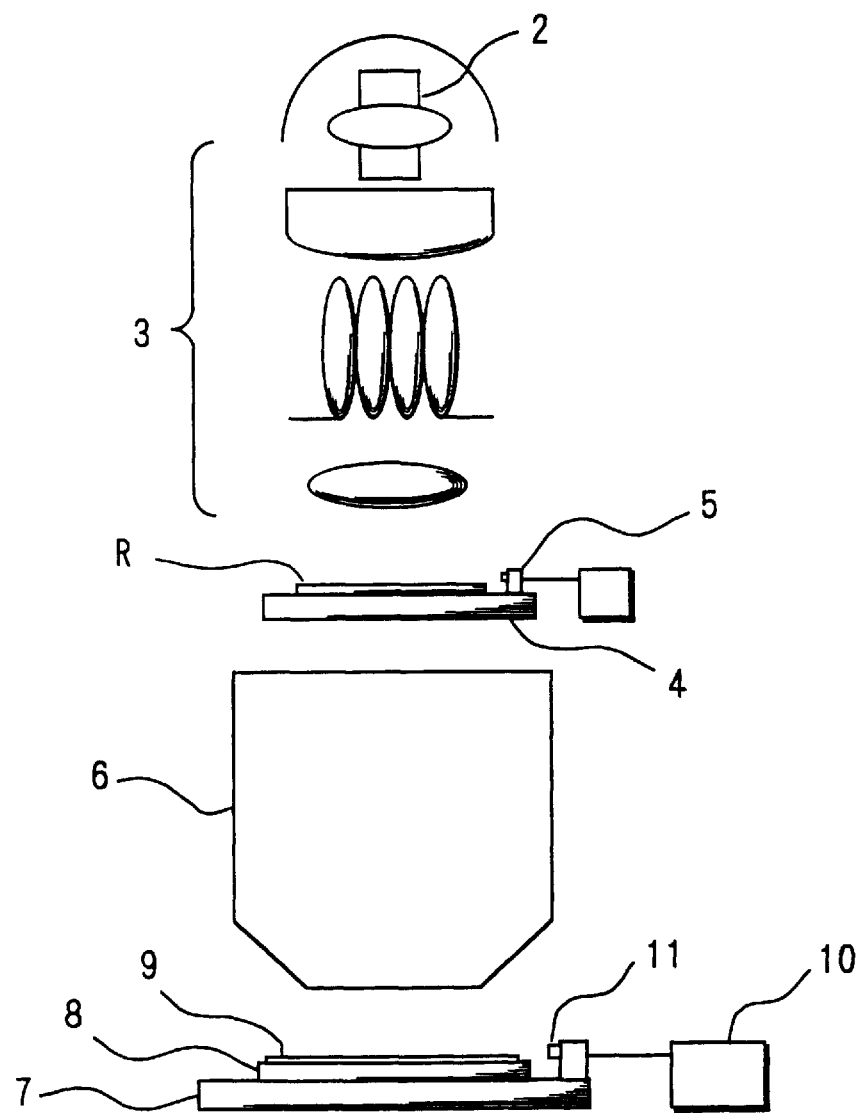
FIG. 2 is a schematic structural diagram of a projection exposure apparatus for projecting a reticle pattern on a wafer in the present invention.

FIG. 2 illustrates a construction of a projection exposure apparatus used in the invention. In the drawing, the projection exposure apparatus includes a light source 2, an irradiation optical system 3, a reticle stage 4, a reticle R, a reticle interference system 5, a projection optical system 6, a wafer stage 7, a wafer chuck 8, a wafer 9, a coordinate measuring system 10, and a moving mirror 11.

The irradiation optical system 3 emits a light from the light source 2 to the reticle R on the reticle stage 4. The projection optical system 6 projects a pattern of the reticle R to the wafer 9 on the wafer stage 7. Thus, the pattern of the reticle R is projected and exposed on the wafer 9. The reticle interference system 5 is employed to determine the x, y, and θ coordinates of the reticle by detecting an alignment mark on the reticle, and comprises a detection system, an interferometer, and a reticle drive system as composing elements (not shown in the drawing). The coordinate measuring system 10 and moving mirror 11 measure the position of the wafer on the wafer stage 7.

Figure 3:
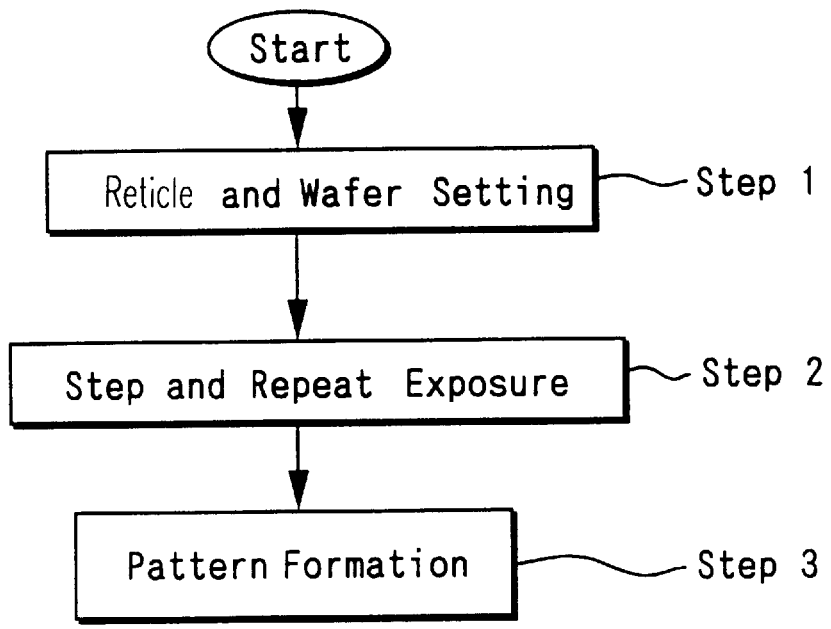
FIG. 3 is a flowchart showing a process of forming a reticle pattern on a wafer in the present invention.

FIG. 3 is a flowchart showing the steps of pattern exposure in which the pattern RP of the reticle R is exposed to the wafer 9 by the exposure apparatus shown in FIG. 2. Following these steps, the process of pattern exposure of the reticle R onto the wafer 9 and the positional deviation occurring in the exposed shot are explained hereinbelow.

First, the reticle R is mounted on the reticle stage 4. At this time, using the reticle alignment mark 1, the rotation amount and positional deviation of the reticle R on the reticle stage 4 are measured by the reticle interference system 5. The rotation amount and positional deviation of the reticle R are corrected by using the reticle interference system 5 and reticle stage 4.

At the same time, the wafer 9 is conveyed onto the wafer stage 7, and is fixed on the wafer chuck 8 by vacuum attraction. At this time, an irradiation light is emitted from the light source 2 to the reticle R on the reticle stage 4 through the irradiation optical system 3, and the pattern of the reticle R is shot to the wafer 9 on the wafer stage 7 through the projection optical system 6. Although the wafer 9 is described as an actual wafer in this example, it is also possible to use any other substrate coated with a photosensitizer, if not an actual wafer, as far as the pattern is transferred on the same position as on the wafer 9.

At this time, a positional deviation on the pattern RP1 being analyzed due to a reticle manufacturing error which is defined as a reticle total error(RTE) occurs as shown in the following expression (1) (Step 1 in FIG. 3).

$$RTE = RE1 \times \frac{1}{5} + MRS + MRK + MTS + MTK + CRS + CRK + CTS + CTK + SS + ORT \quad (1)$$

where:
RE1: Reticle manufacturing error of a reticle pattern (RP1)
MRS: Reticle rotation amount detection defective value (fixed value)
MRK: Reticle rotation amount detection defective value (fluctuating value)
MTS: Reticle deviation detection defective value (fixed value)
MTK: Reticle deviation detection defective value (fluctuating value)
CRS: Reticle rotation amount correction error (fixed value)
CRK: Reticle rotation amount correction error (fluctuating value)
CTK: Reticle deviation correction error (fluctuating value)
SS: Scaling error
ORT: Orthogonal error RE1 denotes a positional deviation, that is a deviation from a designed reference position of the reticle pattern RP1 in reticle manufacturing, and ×⅕ shows that the positional deviation becomes one fifth on the exposed wafer due to the projection optical system.

MRS (rotation amount defective value; fixed value), MRK (rotation amount defective value; fluctuating value), MTS (deviation detection defective value; fixed value), and MTK (deviation detection defective value; fluctuating value) respectively denote detection errors due to the reticle interference system 1.

MRS (reticle rotation amount detection defective value; fixed value) indicates an average of detection errors which occurred at the time of detecting the rotation amount of the reticle. MRK (reticle rotation amount detection defective value; fluctuating value) indicates a fluctuation from the average of the detection errors which occurred at the time of detection of the rotation amount. MTS (reticle deviation detection defective value; fixed value) indicates an average of detection errors which occurred at the time of detection of the central position of the reticle. MTK (reticle deviation detection defective value; fluctuating value) indicates a fluctuation from the average of detection errors which occurred at the time of detection of the central position of a reticle.

CRS (rotation amount correction error; fixed value), CRK (rotation amount correction error; fluctuating value), CTS (deviation correction error; fixed value), and CTK (deviation correction error; fluctuating value) respectively denote correction errors when corrected on the basis of the value determined from the reticle interference system 1.

CRS (reticle rotation amount correction error; fixed value) indicates an average value of correction errors which occurred at the time of rotation correction of the reticle on the basis of detected data. CRK (reticle rotation amount correction error; fluctuating value) is a fluctuation from the mentioned average value of correction errors which occurred at the time of rotation correction of the reticle on the basis of detected data. CTS (reticle deviation correction error; fixed value) indicates an average value of correction errors occurred at the time of correction of central position of the reticle on the basis of detected data. CTK (reticle deviation correction error; fluctuating value) is a fluctuation from the mentioned average value of correction errors occurred at the time of correction of the central position of the reticle on the basis of detected data.

SS (scaling error) means an error caused by the weight of the reticle when the reticle is set on the reticle stage 7 (stopper), and is an error related to the span of the reticle R. ORT (orthogonal error) indicates an error due to loss of equilibrium and means an error caused by losing a balance when the reticle R is sucked at four corners by a vacuum at the time of setting on the stage 7.

The reticle R is set in the exposure apparatus with its alignment mark 1 as a reference, and it is to be noted that likewise in the alignment mark 1, errors such as a rotation error, and a deviation error take place.

Then, the exposure light emitted from the light source 2 irradiates the reticle R in a uniform luminous intensity through the irradiation optical system 3, and the pattern image of the reticle R is projected in each shot region on the wafer 9 through the projection optical system 6.

Figure 4:
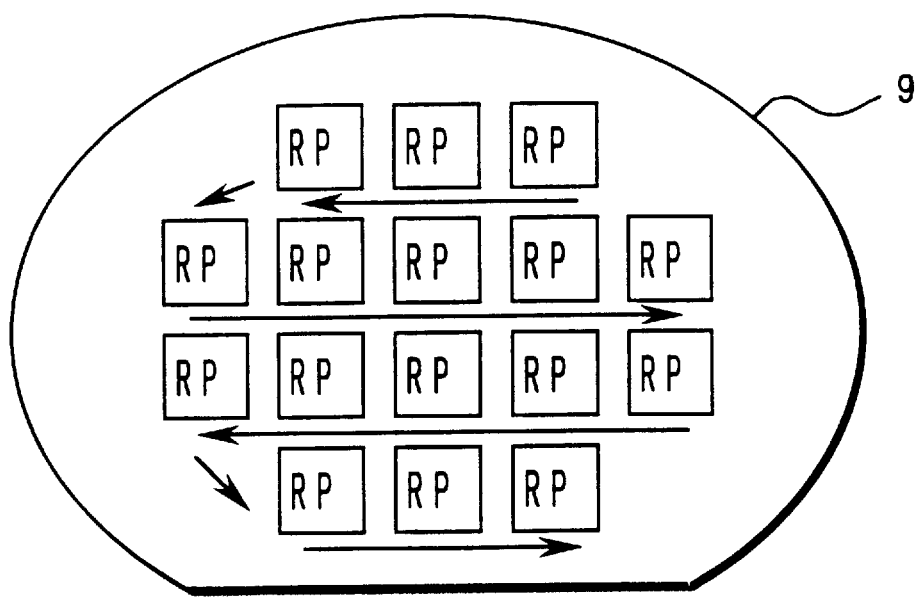
FIG. 4 is a diagram showing a pattern formed on a wafer in the present invention.

FIG. 4 shows a state of exposure of the reticle pattern RP on the wafer 9. The arrow in FIG. 4 indicates a sequence of exposure of the wafer 9. The exposure is performed in a step and repeat process by exposing one reticle pattern RP in one shot or exposure and exposing the other reticle patterns in subsequent shots in sequential order, as shown in FIG. 4.

Figure 5:
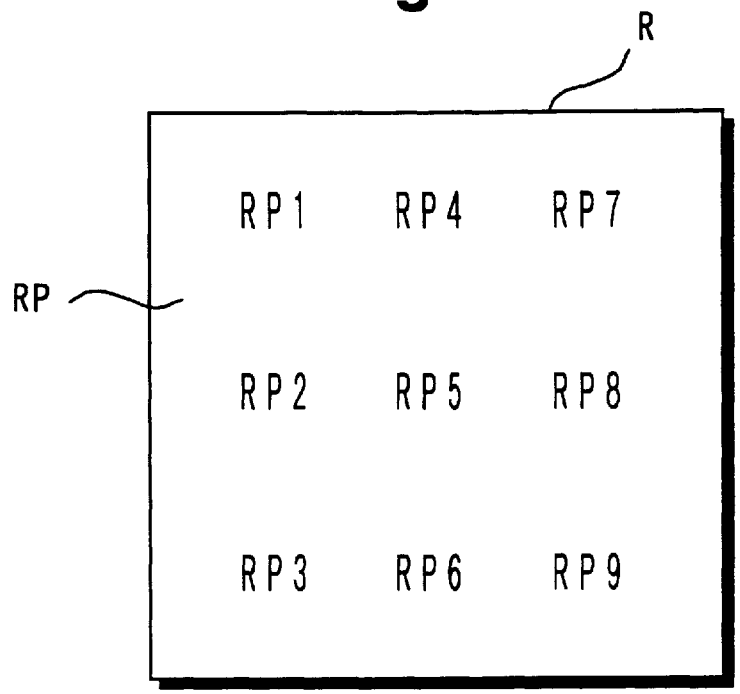
FIG. 5 is an enlarged view of a wafer pattern shown in FIG. 4.

FIG. 5 is an enlarged view of the reticle pattern RP exposed by one shot, and in which patterns RP1 to RP9 are shown therein. This is a projection of the pattern shown in FIG. 1.

Furthermore, at this time, a yawing error correction of the wafer stage 7 is performed in every shot. The yawing error means a shot rotation error occurring in a step feeding of the wafer stage 7. The correction is made in a same way as the correcting of the rotation amount and positional deviation of the reticle R as described above. The rotation amount and positional deviation of the wafer stage 7 are obtained by means of the moving mirror 11 for measuring position of the wafer stage 7 and the coordinate measuring system 10 used in the measurement of the position of the wafer stage 7. Based on the measurement values, a yawing error of the stage 7 is corrected by rotating the reticle R and correcting the rotation of the stage 4 using the reticle interference system 5 and reticle stage 4.

At this time, in the pattern RP1 in the shot, a positional deviation which is defined as a stage total error (STE) occurs as shown in the following expression (2) (Step 2 in FIG. 3).

$$STE = FR + MSS + MSK + MSTS + MSTK + CSRS + CSRK + CSTS + CSTK + DS \quad (2)$$

where:

FR: Aberration amount that the reticle pattern RP1 receives from the projection optical system 6

MSS: Stage rotation amount detection defective value (fixed value)

MSK: Stage rotation amount detection defective value (fluctuating value)

MSTS: Stage deviation detection defective value (fixed value)

MSTK: Stage deviation detection defective value (fluctuating value)

CSRS: Stage rotation amount correction error (fixed value)

CSRK: Stage rotation amount correction error (fluctuating value)

CSTS: Stage position deviation correction error (fixed value)

CSTK: Stage position deviation correction error (fluctuating value)

DS: Array error.

FR denotes an aberration amount that the reticle pattern RP1 receives from the projection optical system 6. This aberration amount results in a positional deviation, and is called distortion.

MSS (rotation amount detection defective value; fixed value), MSK (rotation amount detection defective value; fluctuating value), MSTS (deviation detection defective value; fixed value), and MSTK (deviation detection defective value; fluctuating value) denote detection errors due to the moving mirror 11 for measuring the position of the stage 7 and the coordinate measuring system 10 used in measurement of position of the stage 7.

MSS (stage rotation amount detection defective value; fixed value) indicates an average value of detection errors occurred at the time of detection of a rotation amount of the stage. MSK (stage rotation amount detection defective value; fluctuating value) indicates a fluctuation from the mentioned average value of detection errors which occurred at the time of detection of the rotation amount of the stage. MSTS (stage deviation detection defective value; fixed value) indicates an average value of detection errors which occurred at the time of detection of a central position of the stage. MSTK (stage deviation detection defective value; fluctuating value) indicates a fluctuation from the mentioned average value of detection errors occurred at the time of detection of the central position of the stage.

CSRS (rotation amount correction error; fixed value), CSRK (rotation amount correction error; fluctuating value), CSTS (position deviation correction error; fixed value), and CSTK (deviation correction error; fluctuating value) denotes correction errors when corrected on the basis of the values determined by the moving mirror 11 for measuring the position of the stage 7 and the coordinate measuring system 10 used in measurement of position of the stage 7.

CSRS (stage rotation amount correction error; fixed value) indicates an average value of detection errors which occurred at the time of rotation correction of the stage on the basis of detected data. CSRK (stage rotation amount correction error; fluctuating value) indicates a fluctuation from the mentioned average value of detection errors which occurred at the time of rotation correction of the stage reticle on the basis of detected data. CSTS (stage position deviation correction error; fixed value) indicates an average value of correction errors which occurred at the time of correction of central position of the stage on the basis of detected data. CSTK (stage position deviation correction error; fluctuating value) indicates a fluctuation from the above mean of correction errors which occurred at the time of correction of the central position of the stage on the basis of detected data. DS (array error) denotes a deviation error of an array position occurring when exposing each shot by the step and repeat process, and indicates a deviation of the center position of the shot occurred by exposure by the step and repeat process.

The alignment mark 1 of reticle R is exposed simultaneously with the pattern RP. Therefore, the rotation error, deviation error and array error also occur in the alignment mark 1, in the same manner as the pattern RP.

Then, the pattern RP is formed on the wafer 9 by developing the exposed wafer 9, which is step 3 in FIG. 3.

In the wafer 9 prepared in the mentioned procedure, the positional deviation amount of the reticle patterns RP1 to RP9 are measured by using a wafer position deviation measuring instrument, for example, a measuring instrument such as a model LMS2020 of Leica. The deviation amount measured at this time (total error: TE1) is a sum of the expressions (1) and (2) for the reticle pattern RP1, as shown in the following expression (3).

$$\begin{aligned} TE &= RTE + STE \\ &= RE1 \times 1/5 + MRS + MRK + MTS + MTK + CRS + CRK + \\ &\quad CTS + CTK + SS + ORT + FR + MSS + MSK + MSTS + \\ &\quad MSTK + CSRS + CSRK + CSTS + CSTK + DS + ME \end{aligned} \quad (3)$$

where:

RE1: Reticle manufacturing error of reticle pattern (RP1)

MRS: Reticle rotation amount detection defective value (fixed value)

MRK: Reticle rotation amount detection defective value (fluctuating value)

MTS: Reticle deviation detection defective value (fixed value)

MTK: Reticle deviation detection defective value (fluctuating value)

CRS: Reticle rotation amount correction error (fixed value)

CRK: Reticle rotation amount correction error (fluctuating value)

CTS: Reticle deviation correction error (fixed value)

CTK: Reticle deviation correction error (fluctuating value)

SS: Scaling error

ORT: Orthogonal error

FR: Aberration amount that the reticle pattern (RP1) receives from the projection optical system.

MSS: Stage rotation amount detection defective value (fixed value)

MSK: Stage rotation amount detection defective value (fluctuating value)

MSTS: Stage deviation detection defective value (fixed value)

MSTK: Stage deviation detection defective value (fluctuating value)

CSRS: Stage rotation amount correction error (fixed value)

CSRK: Stage rotation amount correction error (fluctuating value)

CSTS: Stage position deviation correction error (fixed value)

CSTK: Stage position deviation correction error (fluctuating value)

DS: Array error

ME: Measurement error

The measurement error (ME) is an error occurring when measuring a pattern on the wafer by a measuring instrument, for example, a measuring instrument such as a model LMS2020 of Leica.

Then, the errors shown in the expression (3) are reduced by using several techniques. First, the measurement error (ME) may be removed by increasing the number of times the measurement occurs and utilizing an average of the values obtained by those measurements.

Further, errors other than RE1×⅕ (⅕ of reticle manufacturing error of reticle pattern RP1), SS (scaling error), ORT (orthogonal error), and FR (aberration amount that the reticle pattern RP1 receives from the projection optical system), may be removed for the following reasons.

As for the rotation amount and positional deviation of the shot, the alignment mark 1 and the pattern RP1 are formed on the wafer 9 are the same. For measuring the positional deviation amount of the patterns RP1 to RP9, first the rotation of the shot is corrected on the basis of the alignment mark 1 and further, the reference point is determined. Therefore when measuring the patterns RP1 to RP9, the errors due to rotation and deviation of the reticle and wafer stage are eliminated. This holds true also with the array error.

Consequently, a final deviation amount which is defined as a total error (TE) is given by the following expression (4)

$$TE = RE1 \times \tfrac{1}{5} + SS + ORT + FR \quad (4)$$

where:

RE1: Reticle manufacturing error of reticle pattern RP1

SS: Scaling error

ORT: Orthogonal error

FR: Aberration amount that the reticle pattern RP1 receives from the projection optical system 6.

Figure 6:
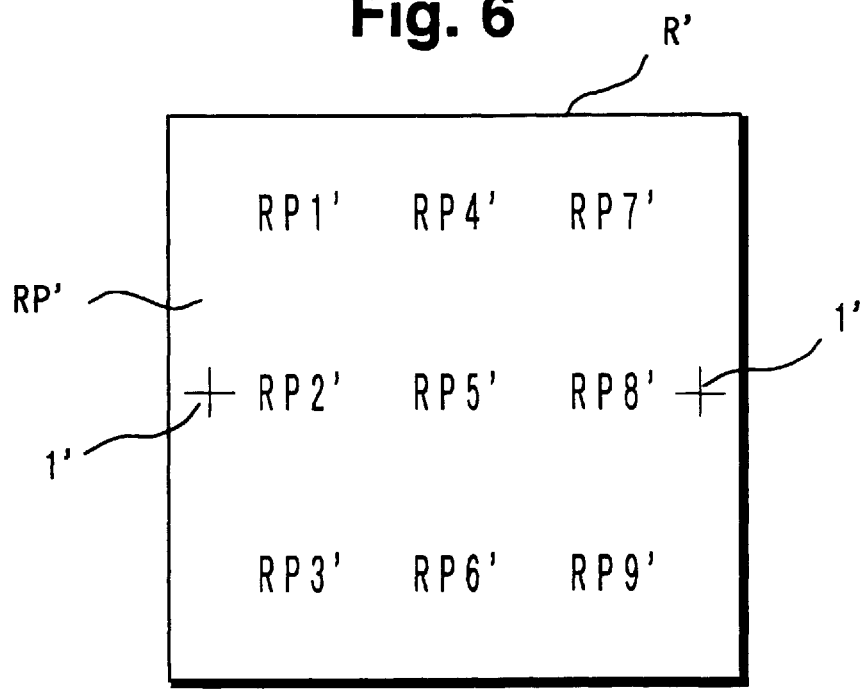
FIG. 6 is an enlarged view of another wafer pattern.
Figure 9:
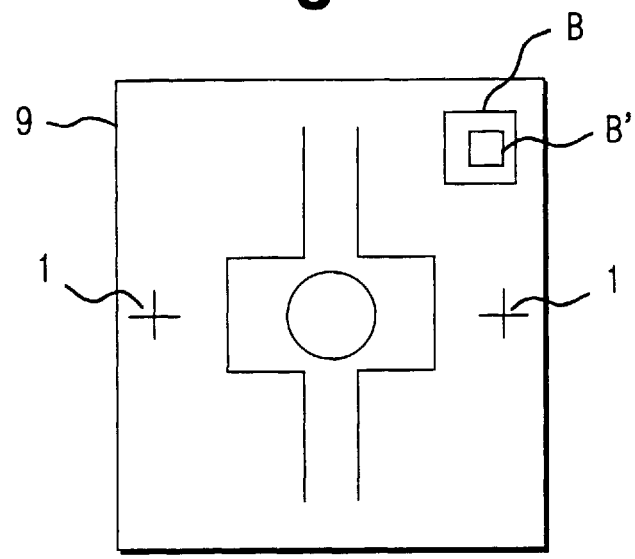
FIG. 9 is a schematic diagram of the patterns overlaid on a wafer.
Figure 10:
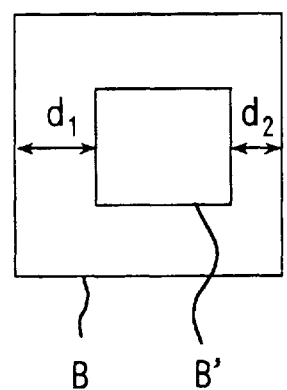
FIG. 10 is an enlarged schematic diagram of target patterns overlaid on a wafer.

Next, the same process as the foregoing is applied to another reticle R'. FIG. 6 shows an example of a set of patterns drawn on another reticle R'. In the drawing, the reticle R' includes a reticle alignment mark 1, a set of patterns RP' and individual patterns RP1' to RP9'. Also in this reticle R', a middle point of the two reticle alignment marks 1 is a central point, and the reticle alignment marks 1 and the central point are regarded as position references. The patterns RP1' to RP9' on the reticle R' are supposed to have positional deviations RE1' to RE9' from the designed reference position.

The reticle R' is mounted on the reticle stage 4 in the projection exposure apparatus, and its pattern is formed on another wafer 9 on the wafer stage 7 by a phototransfer technique in the same manner as the preceding reticle R. Then, the positional deviation of the pattern on the wafer 9 is measured using the wafer position deviation measuring device on the basis of the alignment mark 1 formed on the wafer. This process is the same as performed for the preceding reticle R, and the detailed description is omitted herein. As a result of such a measuring process, a final deviation amount which is defined as a total error (TE') is measured for the reticle R' as shown in the following expression (5):

$$TE' = RE1' \times \tfrac{1}{5} + SS' + ORT' + FR' \quad (5)$$

where:

RE1': Reticle manufacturing error of reticle pattern RP1'

SS: Scaling error

ORT': Orthogonal error

FR': Aberration amount that the reticle pattern RP1' receives from the projection optical system 6.

A difference between positional deviation amounts of the patterns RP and RP' in the same coordinates of the two reticles R, R', i.e., the relative error (DE) in the reticle manufacture, may be deduced from the difference between the deviation amount of reticle R (total error: TE) and the deviation amount of the reticle R' (total error: TE').

Since the shot exposed using the reticle R and the shot exposed using the reticle R' are both exposed by the same projection exposure apparatus and controlled in the same condition, the scaling errors are the same (SS=SS'), the orthogonal errors are the same (ORT=ORT'), and the aberration amounts that the reticle patterns RP1, RP1', receive from the projection optical system 6 are also the same (FR=FR').

Accordingly, the difference (DE) between the deviation amounts of patterns RP, RP' in the same coordinates of reticles R, R' is as shown in the following expression (6):

$$\begin{aligned} DE &= TE - TE' \\ &= (RE1 - RE1') \times \tfrac{1}{5} \end{aligned} \quad (6)$$

From the above expression (6), the relative error (RE1−RE1') of deviation amounts of patterns RP, RP' in the same coordinates of the two reticles R, R' is obtained by multiplying the difference between the deviation amounts (TE−TE') by five, in the same coordinates, of patterns RP, RP' which are transferred on the wafers.

As has been described so far, in accordance with the present invention, first, all patterns of a plurality of for example two, objective reticles are formed on a plurality of, for example two, wafers by the photo-transfer technique using a stepper. As a result, the two wafers have all patterns thereon. Among the patterns formed on the wafers, and with particular regard to the patterns located on the same coordinate position, each positional deviation is measured by using a wafer position deviation measuring instrument, and a difference between the measured values is obtained. Thus, a relative error of drawing position error of two reticles is obtained when this difference is returned by a reduction rate of a projection optical system, for example, a five-folded in case of a reduction rate of ⅕.

Thus, in accordance with the present invention, in the same manner as in an actual manufacturing process, reticles are mounted on a reticle stage, and the reticle patterns are transferred onto the wafers. And by measuring the transferred patterns, an error factor at the time of measuring the reticles individually or an error factor at the time of measuring without mounting the reticles on the reticle stage may be eliminated, whereby a relative position deviation of practical reticle patterns may be deduced. As a result, the quality of the reticle pattern may be judged, and the reticle manufacturing precision is improved. Using the above-described operation, the present invention contributes to further improvement of manufacturing precision and finer design of wafer patterns.

This invention may be conveniently implemented using a conventional general purpose digital computer or microprocessor programmed according to the teachings of the present specification, as will be apparent to those skilled in the computer art. Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. A method for measuring a relative positional deviation of a common pattern feature on at least two reticles, comprising the steps of:

forming at least two projected reticle patterns on a wafer by a projection exposure device using two reticles;

measuring a positional deviation of each of the at least two projected reticle patterns from a reference point of the pattern on the wafer; and determining a difference in positional deviations between the at least two projected reticle patterns from a difference in the positional deviation of each of the last least two projected patterns at a same coordinate position on said wafer.

2. A method for measuring a relative positional deviation according to claim 1, wherein:

said step of measuring the positional deviation of each of the at least two projected patterns uses an alignment mark as the reference point.

3. A method for measuring a relative positional deviation of a pair of reticle patterns, comprising the steps of:

projecting, using a projection exposure device, a pattern of a first reticle on a reticle stage onto a wafer position of a wafer stage;

projecting, using the projection exposure device, a pattern of a second reticle on the reticle stage onto the wafer position of the wafer stage;

measuring a positional deviation of each projected pattern from a reference point of each pattern formed on said wafer position; and obtaining a relative positional deviation of the patterns of the first and second reticles on the reticle stage from a difference in the positional deviation of each projected pattern on the wafer position.

4. A method for measuring a relative positional deviation according to claim 3, wherein:

said steps of measuring the positional deviations use an alignment mark as the reference point.

5. A method for measuring a relative positional deviation according to claim 3, wherein:

said steps of projecting, measuring, and obtaining project measure and obtain when wafers are mounted at the wafer position of the wafer stage.

6. A method for measuring a relative positional deviation of respective reticle patterns on at least two reticles, comprising the steps of:

forming at least two projected reticle patterns on a wafer or respective wafers by a projection exposure device using two reticles of said at least two reticles;

measuring a positional deviation of each of the at least two projected reticle patterns from a reference point of the respective patterns on the wafer or respective wafers; and determining a difference in positional deviation between the at least two projected reticle patterns from a difference in the positional deviation of each of the at least two projected patterns at a same coordinate position on said wafer or respective wafers.

* * * * *